(12) United States Patent
Li et al.

(10) Patent No.: US 8,853,077 B2
(45) Date of Patent: Oct. 7, 2014

(54) THROUGH SILICON VIA PACKAGING STRUCTURES AND FABRICATION METHOD

(71) Applicant: Semiconductor Manufacturing International Corp., Shanghai (CN)

(72) Inventors: Aileen Li, Shanghai (CN); Jinghua Ni, Shanghai (CN)

(73) Assignee: Semiconductor Manufacturing International Corp, Shanghai (CN)

( * ) Notice: Subject to any disclaimer, the term of this patent is extended or adjusted under 35 U.S.C. 154(b) by 0 days.

(21) Appl. No.: 13/730,833

(22) Filed: Dec. 29, 2012

(65) Prior Publication Data

US 2014/0054791 A1 Feb. 27, 2014

(30) Foreign Application Priority Data

Aug. 21, 2012 (CN) .......................... 2012 1 0299744

(51) Int. Cl.
*H01L 21/44* (2006.01)
*H01L 21/768* (2006.01)
*H01L 23/48* (2006.01)

(52) U.S. Cl.
CPC ..... *H01L 21/768* (2013.01); H01L 2224/14181 (2013.01); H01L 2224/05569 (2013.01); H01L 2224/02372 (2013.01); H01L 2224/13024 (2013.01); H01L 2224/131 (2013.01); *H01L 23/481* (2013.01); H01L 2224/06181 (2013.01)
USPC .......................................... 438/667; 257/774

(58) Field of Classification Search
USPC ................. 257/774, 773, 775, 779, 780–781, 257/E21.597, E21.575, E21.536; 438/667, 438/458, 653, 27, 73, 675, 478, 612, 702, 438/98, 107, 108, 424
See application file for complete search history.

(56) References Cited

U.S. PATENT DOCUMENTS

| | | | | |
|---|---|---|---|---|
| 2003/0003757 | A1* | 1/2003 | Nallan et al. | 438/710 |
| 2004/0161947 | A1* | 8/2004 | Fitzergald | 438/778 |
| 2006/0073757 | A1* | 4/2006 | Hoffmann et al. | 445/24 |
| 2009/0014843 | A1* | 1/2009 | Kawashita et al. | 257/621 |
| 2009/0230044 | A1* | 9/2009 | Bek | 210/198.1 |
| 2010/0109024 | A1* | 5/2010 | Yonehara et al. | 257/84 |
| 2010/0123202 | A1* | 5/2010 | Hofmann | 257/401 |
| 2011/0034027 | A1 | 2/2011 | Kuo et al. | |
| 2013/0093098 | A1* | 4/2013 | Yang et al. | 257/774 |

* cited by examiner

*Primary Examiner* — Julio J Maldonado
*Assistant Examiner* — Robert Bachner
(74) *Attorney, Agent, or Firm* — Anova Law Group, PLLC

(57) ABSTRACT

A method is provided for fabricating a through silicon via packaging structure. The method includes providing a first type substrate, and forming a second type substrate deferent from the first type substrate on the first type substrate. The method also includes forming a semiconductor device on a first surface of the second type substrate, and forming an interlayer dielectric layer on the first surface of the second type substrate. Further, the method includes forming a metal interconnection structure in the interlayer dielectric layer, and forming a through silicon via structure perforating the second type substrate and electrically connecting with the metal interconnection structure. Further, the method also includes removing the first type substrate using a gas etching process or a wet etching process to expose a second surface of the second type substrate and a bottom surface of the through silicon via structure.

15 Claims, 5 Drawing Sheets

US 8,853,077 B2

THROUGH SILICON VIA PACKAGING STRUCTURES AND FABRICATION METHOD

CROSS-REFERENCES TO RELATED APPLICATIONS

This application claims the priority of Chinese patent application No. 201210299744.9, filed on Aug. 21, 2012, the entirety of which is incorporated herein by reference.

FIELD OF THE INVENTION

The present invention generally relates to the field of semiconductor manufacturing technology, and more particularly, relates to through silicon via packaging structures and techniques for fabricating high-performance integrated chips.

BACKGROUND

With the development of the semiconductor technology, the critical size of semiconductor devices has become very small, it is becoming more difficult to include more semiconductor devices in a two-dimensional packaging structure, therefore a three-dimensional packaging becomes an effective method for improving the integration density of chips. Current three dimensional packaging techniques include die stacking and package stacking based on gold wire bonding and three-dimensional stacking based on through silicon via (TSV). Amongst of them, the three dimensional stacking based on the TSV have three advantages. The first advantage is the high integration density. The second advantage is that it can significantly reduce the interconnection length, and can effectively solve a signal delay problem in existing two-dimensional system level chip (SOC) technique. The third advantage is that the TSV technique can integrate chips with different functions (such as radio frequency, random access memory, logic and MEMS, etc) to achieve multiple-functions of the packaged chip. Therefore, the three-dimensional stacking process using the TSV interconnection structure is becoming a more and more dominant integrated chip packaging technique.

However, existing methods for forming a TSV structure may often need a chemical mechanical polishing (CMP) process to back grind the silicon substrate. The CMP process may generate stress effect on the silicon substrate and, thus, the thickness of the silicon substrate after the back grinding process cannot be very small. For example, the thickness may be at least 200 μm. Therefore, the depth of the TSV may also be at least 200 μm, the process for forming the TSV structure become more complex, and the production cost is increased. The disclosed methods and systems are directed to solve one or more problems set forth above and other problems.

BRIEF SUMMARY OF THE DISCLOSURE

One aspect of the present disclosure includes a method for fabricating a through silicon via (TSV) packaging structure. The method includes providing a first type substrate, and forming a second type substrate different from the first type of substrate on the first type substrate. The method also includes forming a semiconductor device and an interlayer dielectric layer on a first surface of the second substrate. Further, the method includes forming a metal interconnection structure in the interlayer dielectric layer, and forming a through silicon via structure perforating the second type substrate and electrically connecting with the metal interconnection structure. Further, the method also includes removing the second type substrate using a gas etching process or a wet etching process to expose a second surface of the second type substrate and a bottom surface of the through silicon via structure.

Another aspect of the present disclosure includes a TSV packaging structure. The TSV packaging structure includes a silicon substrate having a first surface and a second surface, a semiconductor device on the first surface, and a metal interconnection structure on the semiconductor device. The TSV packaging structure also includes an interlayer dielectric layer on the silicon substrate, a TSV structure perforating the silicon substrate and the interlayer dielectric layer, and a metal layer on one side of the TSV structure. Further, the TSV packaging structure includes a first passivation layer on the interlayer dielectric layer, and a first solder dot on the metal layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
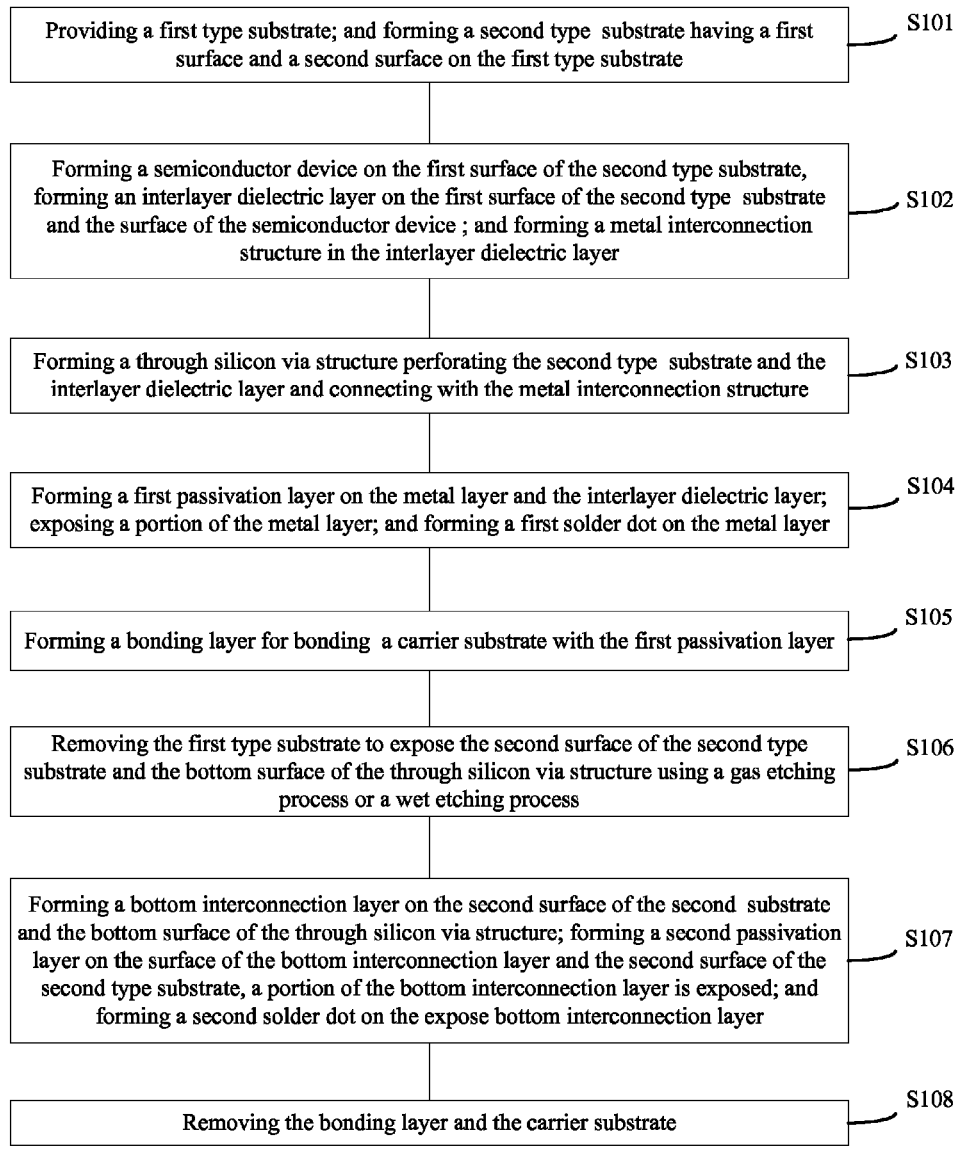
FIG. 1 illustrates an exemplary fabrication process of a TSV packaging structure consistent with the disclosed embodiments.

FIG. 1 illustrates an exemplary fabrication process of a TSV packaging structure consistent with the disclosed embodiments. FIGS. 2-9 illustrate structures corresponding to certain stages of the exemplary fabrication process.

Figure 2:
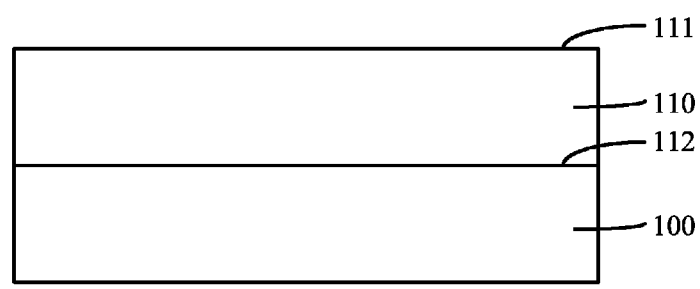
FIGS. 2-9 illustrate structures corresponding to certain stages of an exemplary fabrication process of a TSV packaging structure consistent with the disclosed embodiments.

As shown in FIG. 1, at the beginning of the fabrication process, a first semiconductor substrate is provided (S101). FIG. 2 shows a corresponding structure.

As shown in FIG. 2, a first semiconductor substrate 100 is provided. The first semiconductor substrate 100 may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials or silicon on insulator (SOI). In one embodiment, the first semiconductor substrate 100 is silicon germanium. For illustrative purpose, a silicon germanium substrate 100 will be used throughout the specification to refer to the first semiconductor substrate 100.

The silicon germanium substrate 100 may provide a support layer (base) for subsequently formed semiconductor devices, an interlayer dielectric layer and metal interconnection structures, which provides enough mechanical strength for forming the semiconductor devices, the interlayer dielectric layer and the metal interconnection structures. A thickness of the silicon germanium substrate 100 may be in a range of approximately 50 μm~750 μm, a molar percentage of germanium of the silicon germanium substrate 100 may be in a range of approximately 40%~90%. The molar percentage of germanium may enhance a selective etching ratio of a wet chemical etching.

After providing the silicon germanium substrate 100, a second semiconductor substrate 110 may be formed on one surface of the second semiconductor substrate 100. The second semiconductor 110 may be made of any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, or epitaxially grown materials. In one embodiment, the second semiconductor substrate 110 is silicon. For illustrative purpose, a silicon substrate 110 will be used throughout the specification to refer to the second semiconductor substrate 110. Referring to FIG. 2, the silicon substrate 110 may have a second surface 112 contacting with the silicon germanium substrate 100 and a first surface 111 opposite to the second surface 112.

The silicon substrate 110 may provide a base for subsequently forming semiconductor devices, an interlayer dielectric layer, and metal interconnection structures, etc. The silicon substrate 110 may be formed by various methods, such as a chemical vapor deposition a (CVD) process, a physical vapor deposition (PVD) process, an atomic layer deposition (ALD) process, or an epitaxial growth process. In one embodiment, the silicon substrate 110 is formed by an epitaxial growth process.

The epitaxial process may use one or more of $H_2$, $N_2$, Ar and He to carry one or more of $SiH_4$, $Si_2H_2$, $Si_3H_8$, halosilane and organosilane gas containing silicon into a reaction chamber containing the silicon germanium substrate 100. High temperature chemical reactions may occur inside the reaction chamber to cause the silicon-based gas to deoxygenize or thermal decompose, and the resulted silicon atoms can grow epitaxially on the surface of the silicon germanium semiconductor substrate 100 to form the silicon substrate 110. A gas flow of the silicon source may be in a range of approximately 1 slm~100 slm. A temperature of the reaction chamber may be in a range of approximately 500° C.~800° C. A pressure of the reaction chamber is in a range of approximately 0.1 Torr~600 Torr. A thickness of the epitaxially grown silicon substrate 110 may be in a range of approximately 10 µm~100 µm Because a subsequently formed silicon via may perforate the silicon substrate 110, the depth of the silicon via is corresponding to the thickness of the silicon substrate 110, thus the depth of the silicon via may also be in a range of approximately 10 µm~100 µm. The production cost of the silicon via may be significantly reduced. Further, the damage on the sidewall of the silicon via caused by the formation of the silicon via may be prevented, and the electrical properties of finally formed silicon via may be unlikely to be impacted. In addition, it may be easier to control the thickness of the silicon substrate 110 formed by the epitaxial growth process or the CVD process than to control a thickness of a silicon substrate formed by a CMP process. That is, it may be desired to control the thickness of the finally formed silicon substrate 110 and the depth of the finally formed silicon via by controlling the thickness of the silicon substrate 110 formed by the epitaxial growth process or the CVD process.

Figure 3:
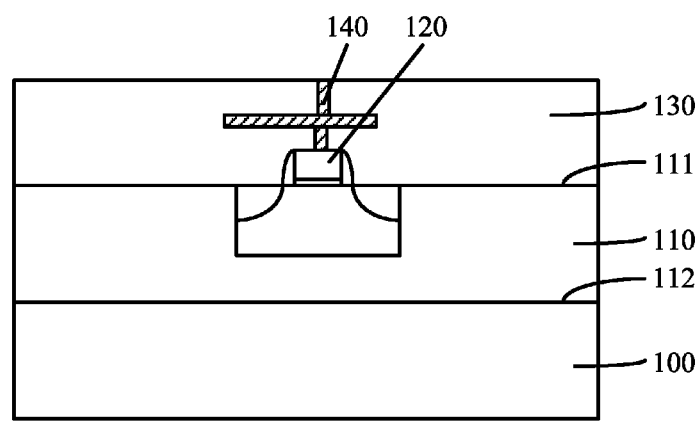

Returning to FIG. 1, after forming the silicon substrate 110, a semiconductor device may be formed on the first surface 111 of the silicon substrate 110 (S102). FIG. 3 shows a corresponding structure.

As shown in FIG. 3, a semiconductor device 120 is formed on the first surface 111 of the silicon substrate 110. The semiconductor device 120 may be one or more of MOS transistor, diode, memory, capacitor, resistor, inductor and MEMS, etc. In one embodiment, the semiconductor device 120 is a MOS transistor.

Further, after forming the semiconductor device 120, an interlayer dielectric layer 130 may be formed on the first surface 111 of the silicon substrate 110 and the surface of semiconductor device 120. The interlayer dielectric layer 130 may be a single dielectric layer or multiple dielectric layers. The interlayer dielectric layer 130 may be formed by various methods, such as a CVD process, or PVD process, etc. The interlayer dielectric layer 130 may be made of any appropriate material, such as silicon oxide, silicon nitride, or silicon oxynitride, etc.

Further, after forming the interlayer dielectric layer 130, a metal interconnection structure 140 may be formed in the interlayer dielectric layer 130. The metal interconnection structure 140 may have metal layers and conductive plugs between the adjacent metal layers. The metal interconnection structure 140 may be formed by any appropriate process, such as a PVD process, or a chemical plating process, etc. The metal interconnection structure 140 may be made of any appropriate conductive material, such as copper, aluminum, or gold, etc.

In one embodiment, a portion of the metal interconnection structure 140 may be exposed by the surface of the interlayer dielectric layer 130, and electrically connected with a subsequently formed through silicon via. In addition, when a first metal solder dot is formed to connect the semiconductor device 120 with an external circuit and/or semiconductor devices on other silicon substrates, the first metal solder dot may electrically connect with the portion of the metal interconnection structure 140 exposed by the interlayer dielectric layer 130.

In other embodiments, when the semiconductor device connects with an external circuit and/or semiconductor devices on other semiconductor substrates on the second surface 112 of the silicon substrate 110 by a TSV structure, it may be unnecessary for the metal interconnection structure 140 to be exposed on the surface of the interlayer dielectric layer 130.

Figure 4:
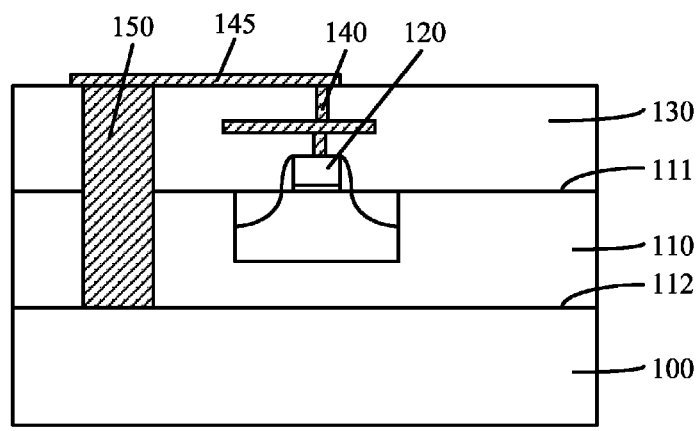

Returning to FIG. 1, after forming the semiconductor device 120, the interlayer dielectric layer 130 and the interconnection structure 140, a through silicon via structure perforating the silicon substrate 110 and the interlayer dielectric layer 130 may be formed (S103). FIG. 4 shows a corresponding structure.

As shown in FIG. 4, a through silicon via (TSV) structure 150 perforating silicon substrate 110 and the interlayer dielectric layer 130 is formed. Various methods may be used to form the TSV structure 150. In one embodiment, the method for forming the TSV structure 150 may include sequentially: etching the interlayer dielectric layer 130 and the silicon substrate 110 to form a first via perforating the silicon substrate 110 and the interlayer dielectric layer 140 (not shown), the depth of the first via may be equal to, or greater than the total thickness of the silicon substrate 110 and the interlayer dielectric layer 140; forming an isolating layer on side surface and bottom surface of the first via (not shown); forming a diffusion barrier layer on the isolating layer (not shown); and filling the first via with a metal material.

Various fabrication processes may be used to form the first via, such as a dry etching process including a deep reactive ion etching (DRIE) process or an ion beam etching process, etc., or a wet chemical etching. In one embodiment, the first via is formed by a DRIE process. Various fabrication processes may be used to form the isolation layer and the diffusion barrier layer, such as a CVD process, or PVD process, etc. Various processes may be used to fill the first via, such as a PVD process, or an electroplating process, etc. In one embodiment, the first via is filled by an electroplating process.

The isolating layer may be made of any appropriate material, such as silicon oxide, silicon nitride, or silicon oxynitride, etc. In one embodiment, the isolating layer is silicon oxide. The diffusion barrier layer may be made of any appropriate material, such as titanium, tantalum, tantalum nitride, or titanium nitride, etc. The metal material for filling the first via may include copper, aluminum, good, silver, or other appropriate conductive material. In one embodiment, the material for filling the first via is copper.

After filling the first via with copper, a CMP process may be used to remove a portion of the isolating layer, the diffusion barrier layer and the copper layer on the interlayer dielectric layer 130. Thus the diffusion barrier layer and copper in the first via may form the TSV structure 150.

Further, after forming the TSV structure 150, a metal layer 145 may be formed on the surface of the TSV structure 150 and the interlayer dielectric layer 130, and the metal layer 145 may connect with the interconnection structure 145, thus the TSV structure 150 connect with the semiconductor device 120 through the metal layer 145.

The metal layer 145 may be made of any appropriate conductive material, such copper, gold, aluminum, or titanium, etc. Various methods may be used to form the metal layer 145, such as a PVD process, or an electroplating process, etc.

In another embodiment, the TSV structure 150 may be formed before forming the semiconductor device 120. Specifically, the method for forming the TSV 150 may include sequentially: forming the silicon substrate 110 on the silicon germanium substrate 100; forming a second via by etching the silicon substrate 110, the depth of the second via may be equal to, or greater than the thickness of the silicon substrate 110; forming an isolating layer on side surface and bottom of the second via; forming a diffusion barrier layer on the isolating layer; filling the second via using copper metal layer; and polishing away a portion of the copper metal layer, the diffusion barrier layer and the isolating layer on the silicon substrate 110. Thus the copper metal layer and the diffusion barrier layer in the second via may form the TSV structure 150.

After forming the TSV structure 150, a conductive plug may be formed on the TSV structure 150 to electrically connect with the subsequently formed interconnection structure 140, the TSV structure 150 may connect with the semiconductor device 120 by the conductive plug. Because the TSV structure 150 may be formed before forming the semiconductor device 120, the TSV structure 150 with a relatively large volume may be unlikely to impact the semiconductor device 120. In addition, because the TSV structure 150 may be unnecessary to perforate the interlayer dielectric layer 130, the depth of the TSV structure 150 may be relatively small, the production cost of the TSV structure 150 may be relatively low.

In another embodiment, the TSV structure 150 may be formed after forming the semiconductor device 120 and a first interlayer dielectric layer (may refer to the interlayer dielectric layer 130). Specifically, the method for forming the TSV 150 may sequentially include: forming the silicon substrate 110 on the silicon germanium substrate 100; forming the semiconductor device 120 on the silicon substrate 110; forming the first interlayer dielectric layer 130 on the silicon substrate 110 and the semiconductor device 120; forming a third via by etching the silicon substrate 110 and the first interlayer dielectric layer 130, the depth of the third via may be equal to, or greater than the total thickness of the silicon substrate 110 and the first interlayer dielectric layer 130; forming an isolating layer on side surface and bottom of the third via; forming a diffusion barrier layer on the isolating layer; filling the third via using a copper metal layer; and polishing away a portion of the copper metal layer, the diffusion barrier layer and the isolating layer on the first dielectric layer 130. Thus the copper metal layer and the diffusion barrier layer in the third via may form the TSV structure 150. The fabrication process and materials of each structure may be similar with the above mentioned embodiments, the details are omitted herein.

After forming the TSV structure 150, a conductive plug electrically connecting with the semiconductor device 120 may be formed in the first interlayer dielectric layer 130, and a first metal interconnection layer may be formed on the top surface of the TSV structure 150, the top surface of the first interlayer dielectric layer 130 and the top surface of the conductive plug to connect the TSV structure 150 with the semiconductor device 120. A plurality of interlayer dielectric layers may be formed on the first interlayer dielectric layer 130, and plurality of metal interconnection layers and conductive plugs may be formed between the adjacent interlayer dielectric layers. The plurality of metal interconnection layers and conductive plugs may form the metal interconnection structure 140, and the TSV structure 150 may connect with the semiconductor device 120 by the metal interconnection structure 140. The metal plugs may be formed by the similar methods as the TSV structure 150, or any other appropriate method.

Figure 5:
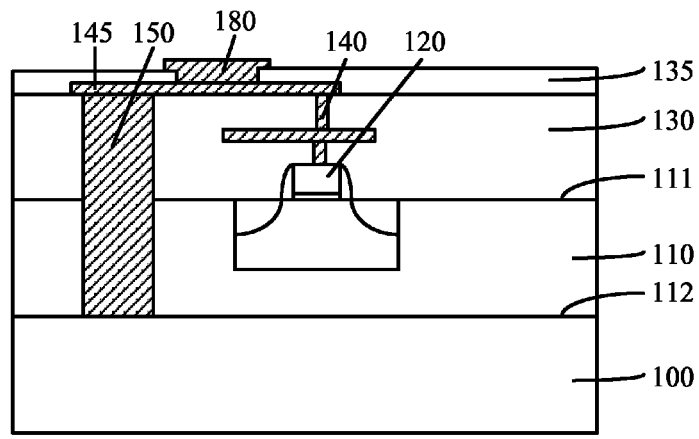

Returning to FIG. 1, after forming the TSV structure 150, a first passivation layer may be formed on the metal layer 145 and the interlayer dielectric layer 130, and a first metal solder dot may be formed one metal layer 145 (S104). FIG. 5 shows a corresponding structure.

As shown in FIG. 5, a first passivation layer 135 is formed on the surface of the metal layer 145 and the interlayer dielectric layer 130. A portion of the metal layer 145 may be exposed by the first passivation layer 135, i.e., the metal layer 145 may be partially covered by the first passivation layer 135. A first solder dot 180 may be formed on the portion of the metal layer 145 exposed by the first passivation layer 135.

The first passivation layer 135 may be made of any appropriate material, such as silicon oxide, silicon nitride, silicon oxynitride, or a combination thereof. The first passivation layer 135 may be formed by any appropriate process, such as a CVD process, or a PVD process, etc. The metal layer 145 may be exposed by the passivation layer 145 by any appropriate process. For example, a portion of the passivation layer 145 may be patterned, and etched by a dry etching process or a wet etching process. The passivation layer 145 may be used to prevent the metal layer 145 being affected by a later-used wet etching process. In one embodiment, the semiconductor device 120 may electrically connect with an external circuit and/or semiconductor devices on other substrates through the metal interconnection structure 140 and the solder dot 180.

The first solder dot 180 may include a solder pad or a solder ball. The solder pad may be made of any appropriate material, such copper, gold, or silver, etc. The solder ball may be made of any appropriate material, such as lead-based material, or tin based material, etc. The solder pad may be formed by any appropriate process, such as a PVD process, an electroplating process, or a printing process, etc. The solder ball may be formed by any appropriate process, such a casting process, etc.

In another embodiment, when the semiconductor device 120 electrically connects with an external circuit and/or semiconductor devices on other substrates by the TSV structure 150 on the second surface 112 of the silicon substrate 110, it may be unnecessary to form the first solder dot 180.

Figure 6:
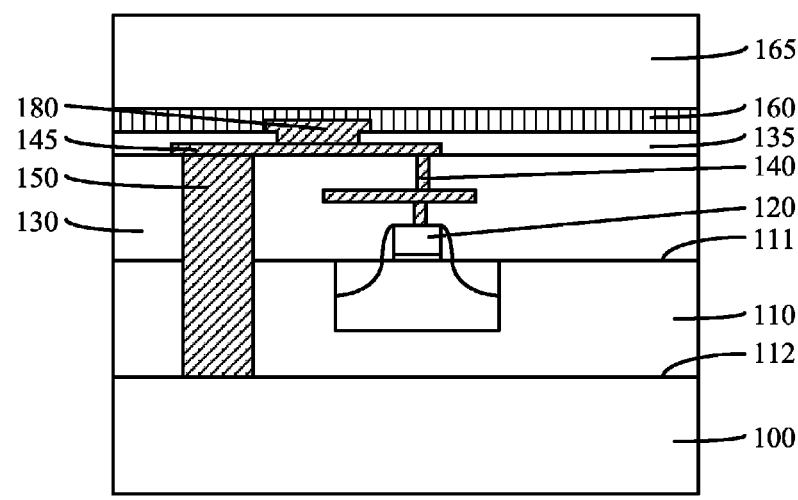

Returning to FIG. 1, after forming the first passivation layer 135 and the first solder dot 180, a bonding layer may be formed on the first passivation layer 135 and the first solder dot 180, followed by bonding a carrier substrate with the first passivation layer 135 (S105). FIG. 6 shows a corresponding structure.

As shown in FIG. 6, a bonding layer 160 is formed on the first passivation layer 135. The bonding layer 160 may be used to bond a carrier substrate 165 with the first passivation layer 135. The bonding layer 160 may be made of any appropriate bonding material. In one embodiment, the bonding layer 160 may be a non-permanent adhesive, and may be removed by a heating process, and/or a soaking process in any appropriate solution in subsequent process.

The carrier substrate 165 may be made of any appropriate material, such as glass, silicon, organic material, ceramic, or metal material, etc. Because the carrier substrate 165 may be bonded with the first passivation layer 135, the mechanical properties of the silicon substrate 110 and the interlayer dielectric layer 130 may be improved, the silicon substrate 110 and the interlayer dielectric layer 130 may be less likely to crack or break when the silicon germanium substrate 100 is subsequently removed. In addition, because the surface of the first solder dot 180 exposed by the first passivation layer 135 may be covered by the bonding layer 160 and the carrier substrate 165, solution of a subsequently used wet etching process may be unlikely to damage the first solder dot 180.

In another embodiment, if the first solder dot 180 and the first passivation layer 135 are not formed on the interlayer dielectric layer 130, the bonding layer 160 may be formed on the interlayer dielectric layer 130, and the bonding layer 160 may directly bond the carrier substrate 165 with the interlayer dielectric layer 130.

In another embodiment, the bonding layer 160 may be omitted, and the silicon germanium substrate 100 may be directly removed after forming the first solder dot 180 and the first passivation layer 135 without bonding the carrier substrate 165 with the first passivation layer 135. The silicon germanium substrate 100 may be removed by a wet etching process. Because the wet etching process may be unlikely to generate a stress effect on the silicon substrate 110, even only the thin silicon substrate 110 and the interlayer dielectric layer 130 are used to support the semiconductor device. Thus, the wet etching process for removing the silicon germanium substrate 100 may be less likely to cause the silicon substrate 110 to crack or break. Therefore, some process steps may be skipped.

In addition, a spray method may be used to spray an etching solution on one surface of the silicon germanium substrate 110 without devices and structures during the wet etching process for removing the silicon germanium substrate 110. The etching solution may be less likely to damage the first solder dot 180 on the other side of the silicon germanium substrate 110.

Figure 7:
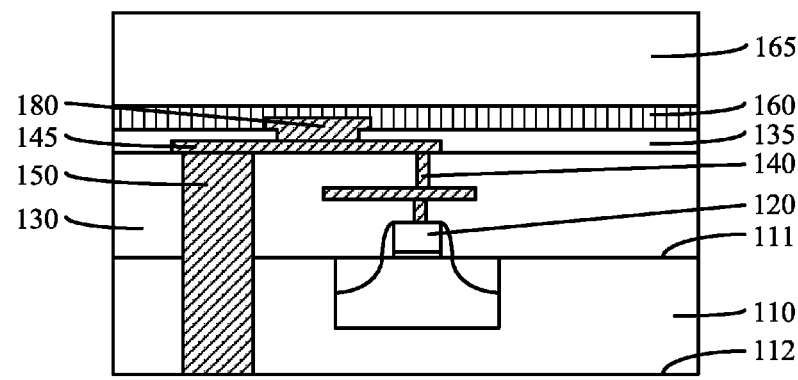

Returning to FIG. 1, after bonding the carrier substrate 165, the silicon germanium substrate 100 may be removed to expose the second surface 112 of the silicon substrate 110 and the bottom surface of the TSV structure 150 (S106). The corresponding structure is shown in FIG. 7.

The silicon germanium substrate 100 may be removed by any appropriate process, such as a dry etching process, a wet etching process, a CMP process, or a gas etching process, etc. In one embodiment, the silicon germanium substrate is removed by a gas etching process.

Various etching gases may be used to etching the silicon germanium substrate 100, such as HBr, HCl, or HF, etc.

In one embodiment, the etching gas of the gas etching process is HCl. A gas flow of HCl may be set in a range of approximately 20 sccm~200 sccm. A pressure of the reaction chamber may be set in a range of approximately 0.05 Torr~1 Torr. A temperature of the reaction chamber may be set in a range of approximately 300° C.~800° C. The HCl etching gas may have an etching selectivity ratio greater than 100:1 to a silicon germanium material having a germanium molar percentage of approximately 40%~90% and a silicon material.

Therefore, the gas etching process may have less consumption of the silicon substrate 110 when the HCl etching gas is used to remove the silicon germanium substrate 100, and the thickness of the silicon substrate 110 may be effectively controlled. In addition, the gas etching process may have no stress effect on the silicon substrate 110, the silicon substrate 110 may be less likely to crack or break even the thickness of the silicon substrate 110 is very small. The final thickness of the silicon substrate 110 is much smaller than the thickness of a silicon substrate in the existing process. The thinner silicon substrate 110 may help to minimize the chip size, effectively lower the depth of the TSV structure 150, and lower the production cost of the TSV structure 150.

In another embodiment, the silicon germanium substrate 100 may be removed by a wet etching process. Various etching liquids may be used to etching the silicon germanium substrate 100, such as a HBr solution, a HCl solution, or a HF solution, etc. In one embodiment, the etching liquid of the wet etching process is a hot HCl solution. A soaking method or a spray method may be used to transfer the hot HCl solution to the surface of the silicon germanium substrate 100, and etch way the silicon germanium substrate 100. The hot HCl etching solution may have an etching selectivity ratio greater than 100:1 to a silicon germanium material having a germanium molar percentage of approximately 40%~90% and a silicon material. Therefore, the wet etching process may have less consumption of the silicon substrate 110 when the hot HCl solution is used to remove the silicon germanium substrate 100, and the thickness of the silicon substrate 110 may be effectively controlled.

In addition, the wet etching process may have no stress effect on the silicon substrate 110, the silicon substrate 110 may be less likely to crack or break even the thickness of the silicon substrate 110 is very small. The final thickness of the silicon substrate 110 is much smaller the thickness of a silicon substrate in existing process. The thinner silicon substrate 110 may help to minimize the chip size, effectively lower the depth of the TSV structure 150, and lower the production cost of the TSV structure 150.

Because the depth of the TSV structure 150 may be greater than, or equal to the total thickness of the silicon substrate 110 and the interlayer dielectric layer 130, a portion of the TSV structure 150 may be exposed during removing the silicon germanium substrate 100. However, the metal filled in the TSV structure 150 may be copper, and copper does not react with HCl, so that the hot HCl etching solution may be less likely to damage the TSV structure 150.

In certain other embodiments, the silicon germanium substrate 100 may be thinned by a back-grinding process before the gas etching process or the wet etching process is used. The back-grinding process may include any one or more of a grinding process, a milling process, a CMP process, a dry polishing process, an electrical etching process, a plasma assisted chemical etching (PACE) process, and an atmospheric downstream plasma etching (ADPE) process, etc. When the silicon germanium substrate 100 is thinned to a certain thickness, the gas etching process or the wet etching process may be used to remove the remaining silicon germanium substrate 100 until the second surface 112 of the silicon substrate 110 and the bottom surface of the TSV structure 150 are exposed.

Because the silicon germanium substrate 100 may be relatively thick, and the total mechanical strength of the silicon germanium substrate 100 and the silicon substrate 110 may be relatively large, the silicon germanium substrate 100 and the silicon substrate 110 may be less likely to crack and/or break by an initial stage of the back-grinding process for thinning the silicon germanium substrate 100 at a very fast speed.

When the silicon germanium substrate 100 becomes thinner and thinner, the total mechanical strength of the silicon germanium substrate 100 and the silicon substrate 110 may correspondingly become smaller, the back-grinding process may cause the silicon germanium substrate 100 and the silicon substrate 110 to crack and/or break. Therefore, when the silicon germanium substrate 100 is thinned to a certain thickness, the gas etching process or the gas etching process may be used to remove the remaining silicon germanium substrate 100. The certain thickness may be determined by thickness of the silicon substrate 110, and the thickness and material of the interlayer dielectric layer 130. In one embodiment, a value of the certain thickness is approximately 100 μm.

Figure 8:
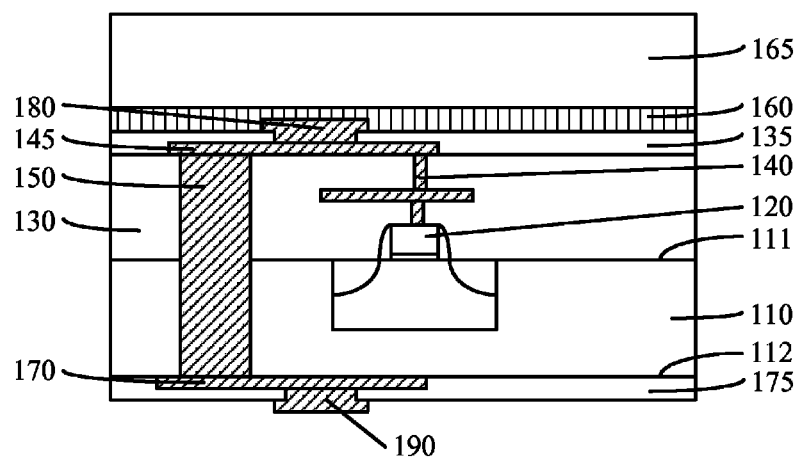

Returning to FIG. 1, after removing the silicon germanium substrate 100, a bottom interconnection layer may be formed on the second surface 112 of the silicon substrate 110 and the bottom surface of the TSV structure 150 (S107). FIG. 8 show a corresponding structure.

As shown in FIG. 8, a bottom interconnection layer 170 is formed on the second surface 112 of the silicon substrate 110 and the bottom surface of the TSV structure 150. The bottom connection layer 170 may be made of any appropriate material, such as aluminum, copper, or aluminum copper alloy, etc. Various fabrication processes may be used to form the bottom interconnection layer 170, such as a sputter process, an electrical deposition process, or a Damascene process, etc.

Referring to FIG. 8, after forming the bottom interconnection layer 170, a second passivation layer 175 may be formed on the bottom interconnection layer 170 and the second surface 112 of the silicon substrate 110. The second passivation layer 175 may be made of any appropriate material, such as silicon oxide, silicon nitride, silicon oxynitride, or a combination thereof. The second passivation layer 175 may be formed by any appropriate process, such as a CVD process, or a PVD process, etc. The second passivation layer 175 may used to prevent the bottom interconnection layer (metal layer) 170 being affected by the wet etching process.

A portion of the bottom interconnection layer 170 may be exposed by the second passivation layer 175, i.e., the second passivation layer 175 may have an opening, and a second solder dot 190 may be formed on the portion of the interconnection layer 170 exposed by the second passivation layer 175. The opening of the second passivation layer 175 may be formed by any appropriate process, such as a dry etching process, or a wet etching process, etc. The second solder dot 190 may include a solder pad or a solder ball. The solder pad may be made of any appropriate material, such as copper, gold, or silver, etc. The solder ball may be made of any appropriate material, such as lead-based material, or tin based material, etc. The solder pad may be formed by any appropriate process, such as a PVD process, an electroplating process, or a printing process, etc. The solder ball may be formed by any appropriate process, such a casting process, etc. In one embodiment, the TSV structure 150 may electrically connect with an external circuit and/or semiconductor devices on other semiconductor substrates through the bottom interconnection layer 170 and the second solder ball 190.

Figure 9:
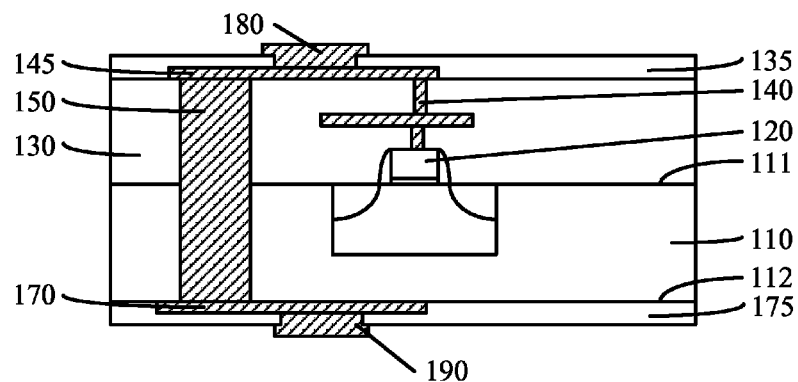

Returning to FIG. 1, after forming the bottom interconnection layer 170, the second passivation layer 175, and the second solder ball 190, the carrier substrate 165 may be removed (S108). FIG. 9 shows a corresponding structure.

The carrier substrate 165 may be removed by any appropriate process. In one embodiment, a high temperature baking process or a soaking process may used to make the bonding layer 160 to be melted or dissolved, and the carrier substrate may 165 be peeled off the first passivation layer 135. In one embodiment, a high temperature baking process may be used to peel off the carrier substrate 165 from the first passivation layer 135. A temperature of the high temperature baking process may be in a range of approximately 120° C.~200° C. Other appropriate process may also be used to peel off the carrier substrate 165 from the passivation layer 135. A TSV packaging structure having the silicon substrate 110, the interlayer dielectric layer 130 and the TSV structure 150 may be finally formed. A subsequent stacked packaging may be performed using a plurality of the TSV packaging structures 150.

By using the disclosed methods and structures, the silicon germanium substrate 100 is removed by the gas etching process or the wet etching process after forming the TSV structure 150. Because the gas etching process or the wet etching process may be less likely to generate a stress effect on the silicon substrate 110 to cause the silicon substrate to crack and/or break, the silicon substrate 110 may be relatively thin. Therefore, the depth of the TSV structure 150 may be relatively small, and the production cost of the TSV structure 150 may be reduced. In addition, because the depth of the TSV structure 150 may be relatively low, damage of the sidewall of the TSV structure 150 caused by forming a deep via may be prevented.

Further, the molar percentage of the silicon germanium substrate 100 may be in a range of 40%~90%, the gas etching process using the HCl gas or the wet etching process using the hot HCl solution may have a etching selectivity ratio greater than 100:1 to the silicon germanium substrate 100 and the silicon substrate 110. Therefore, the silicon substrate 110 may be less likely to be damaged by the gas etching process or the wet etching process when the silicon germanium substrate 100 is removed.

In another embodiment, a TSV packaging structure may be formed by the above disclosed processes and methods, the corresponding TSV packaging structure is illustrated in FIG. 9.

As shown in FIG. 9, the TSV packaging structure includes the silicon substrate 100 having a first surface 111 and a second surface 112, a semiconductor device 120 on the first surface 111, and a metal interconnection structure 140. The TSV packaging structure also includes an interlayer dielectric layer 130 formed on the silicon substrate 110, a TSV structure 150 perforating the silicon substrate 110 and the interlayer dielectric layer 130, and a metal layer 140 and a bottom interconnection layer 170 on both sides of the TSV structure 150.

Further, the TSV packaging structure includes the first passivation layer 135 formed on the interlayer dielectric layer 130, and the second passivation layer 175 formed on the second surface 112 of the silicon substrate 110. Further, the TSV packaging structure also includes the first solder dot 180 on the metal layer 145, and the second solder dot 190 on the bottom interconnection layer 170. The detailed structures and intermediate structures are described above with respect to the fabrication methods.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a through silicon via packaging structure, comprising:
    providing a first type substrate,
    epitaxially growing a second type substrate directly from a surface of the first type substrate, different from the first type substrate, wherein the epitaxially-grown second type substrate has a first surface and a second surface on the first type substrate;
    forming a semiconductor device on the first surface of the epitaxially-grown second type substrate;
    forming an interlayer dielectric layer on the first surface of the epitaxially-grown second type substrate and a surface of the semiconductor device;
    forming a metal interconnection structure in the interlayer dielectric layer electrically connecting with the semiconductor device;
    forming a through silicon via structure perforating an entire thickness of the epitaxially-grown second type substrate and perforating an entire thickness of the interlayer dielectric layer, the through silicon via structure electrically connecting with the metal interconnection structure by a metal layer on a top surface of the dielectric layer; and
    after forming the through silicon via structure, removing the first type substrate to expose the second surface of the epitaxially-grown second type substrate and a bottom surface of the through silicon via structure.

2. The method according to claim 1, wherein:
    the first type substrate is a silicon germanium substrate; and
    the second type substrate is a silicon substrate.

3. The method according to claim 2, wherein removing the first type substrate further includes:
    removing the silicon germanium substrate using a gas etching process or a wet etching process.

4. The method according to claim 2, wherein:
    thickness of the silicon germanium substrate is in a range approximately 50 μm-750 μm.

5. The method according to claim 2, further comprising:
    controlling a thickness of the silicon substrate in a range approximately 10 μm-100 μm by the epitaxially growing of the silicon substrate as the second type substrate.

6. The method according to claim 2, before removing the first type substrate, further including:
    performing a back-grinding process to thin the silicon germanium substrate as the first type substrate to a certain thickness.

7. The method according to claim 3, wherein:
    etching liquid of the wet etching process is a hot HCl solution.

8. The method according to claim 3, wherein:
    etching gas of the gas etching process is HCl;
    gas flow is in range of approximately 20 sccm-200 sccm;
    pressure of a reaction chamber is in a range of approximately 0.05 Torr-1 Torr; and
    temperature of the reaction chamber is in a range of approximately 300° C.

9. The method according to claim 3, wherein:
    selectivity ratio of the wet etching process or the gas etching process is greater than 100:1 to the silicon germanium substrate and the silicon substrate to reduce damage to the silicon substrate when removing the silicon germanium substrate.

10. The method according to claim 1, before removing the silicon germanium substrate, further including:
    forming a bonding layer on the interlayer dielectric layer; and
    bonding a carrier substrate with the interlayer dielectric layer using the bonding layer.

11. The method according to claim 10, after removing the silicon germanium substrate, further including:
    forming a bottom interconnection layer on the second surface of the silicon substrate and the bottom surface of the through silicon via structure;
    forming a second passivation layer on the bottom interconnection layer and the second surface of the silicon substrate;
    patterning the second passivation layer to expose a portion of the bottom interconnection layer; and
    forming a second solder dot on the bottom interconnection layer.

12. The method according to claim 11, after forming the second solder dot, further including:
    peeling off the carrier substrate from the interlayer dielectric layer by a high temperature baking process or a soaking process.

13. The method according to claim 12, wherein:
    temperature of the high temperature baking process is in range of approximately 120 ° C.-200 ° C.

14. The method according to claim 1, after forming the through silicon via structure, further including:
    forming a first passivation layer on the interlayer dielectric layer; and
    forming a first solder dot to electrically connect with the metal interconnection structure.

15. The method according to claim 2, wherein:
    molar percentage germanium of the silicon germanium substrate is in a range of approximately 40%-90% to provide an etching selectivity ratio greater than 100:1 to the silicon germanium substrate and the silicon substrate.

* * * * *